United States Patent [19]
Fortino et al.

[11] 4,282,646
[45] Aug. 11, 1981

[54] METHOD OF MAKING A TRANSISTOR ARRAY

[75] Inventors: Andres G. Fortino, Essex; Henry J. Geipel, Jr., Essex Junction; Lawrence G. Heller, Essex Junction; Ronald Silverman, Essex Junction, all of Vt.

[73] Assignee: International Business Machines Corporation, Armonk, N.Y.

[21] Appl. No.: 68,282

[22] Filed: Aug. 20, 1979

[51] Int. Cl.³ .................................... H01L 21/26
[52] U.S. Cl. ............................. 29/571; 29/576 B; 148/1.5; 148/187; 148/190; 357/23
[58] Field of Search ............... 29/571, 576 B; 148/1.5, 148/187, 190; 357/23

[56] References Cited
U.S. PATENT DOCUMENTS

| | | | |
|---|---|---|---|
| 3,390,019 | 6/1968 | Manchester | 148/1.5 |
| 3,914,855 | 10/1974 | Cheney et al. | 29/571 |
| 3,950,777 | 4/1976 | Tarui et al. | 148/187 X |
| 3,996,655 | 12/1976 | Cunningham et al. | 148/1.5 X |
| 4,045,811 | 8/1977 | Dingwall | 357/41 |
| 4,059,826 | 11/1977 | Rodgers | 365/104 |
| 4,070,687 | 1/1978 | Ho et al. | 148/190 X |
| 4,096,522 | 6/1978 | Suzuki et al. | 357/45 |
| 4,131,983 | 1/1979 | Matzen | 29/571 |
| 4,142,926 | 3/1979 | Morgan | 29/571 X |
| 4,161,039 | 7/1979 | Rossler | 365/185 |
| 4,173,818 | 11/1979 | Bassous | 29/578 X |
| 4,208,780 | 6/1980 | Richman | 29/578 X |
| 4,209,349 | 6/1980 | Ho et al. | 148/1.5 X |
| 4,214,359 | 7/1980 | Kahng | 29/571 |
| 4,232,439 | 11/1980 | Shibata | 29/576 B |

OTHER PUBLICATIONS
Cauge et al., *Electronics*, Feb. 15, 1971, pp. 99–104.

*Primary Examiner*—G. Ozaki
*Attorney, Agent, or Firm*—Stephen J. Limanek

[57] ABSTRACT

A method of making a transistor array includes forming a plurality of gate electrodes insulated from a semiconductor substrate having an impurity of a given conductivity, introducing a first impurity having a conductivity opposite to that of the given conductivity into a given region of the substrate which is adjacent to an edge of each of the gate electrodes, introducing a second impurity having the given conductivity into given regions adjacent to selected gate electrodes, the second impurity having a significantly higher diffusivity than that of the first impurity in the semiconductor substrate, and driving the second impurity along the surface of the semiconductor substrate to form in the substrate under each of the selected gate electrodes a region having a concentration of impurity of the given conductivity higher than that of the semiconductor substrate. The transistor array may be used, e.g. to make a read only memory (ROM) by connecting appropriate current sensing means to each of the given regions to indicate the presence or absence of the higher diffusivity impurity when a predetermined voltage is applied to the gate electrodes. In one embodiment, the semiconductor substrate is made of P type conductivity, the first impurity is arsenic which produces N type conductivity regions and the second impurity is boron, which produces P type conductivity. Since boron has a higher diffusivity than arsenic, after they are driven by heating the boron impurity produces a high threshold region under the gate electrode when introduced in sufficiently high concentration.

8 Claims, 5 Drawing Figures

METHOD OF MAKING A TRANSISTOR ARRAY

DESCRIPTION

Technical Field

This invention relates to a method of making integrated semiconductor circuits and more particularly to a method of making a transistor array which may be used, e.g., in read only memories having high cell densities and in which the processing steps do not require the array to be personalized until the transistors or cells are nearly completely formed so that the time between array personalization and array completion is very short.

BACKGROUND ART

Integrated semiconductor circuits, particularly arrays having transistors each of which represents a binary digit of information, as in read only memories (ROM), have achieved high device or cell densities.

In, e.g., U.S. Pat. No. 3,914,855, filed May 9, 1974, there is described a read only memory wherein the array has transistors made with a thin gate dielectric exhibiting a low threshold voltage for storing one digit of binary information and transistors made of a thick gate dielectric exhibiting a considerably higher threshold voltage for storing the other digit of binary information. This patent also describes a read only memory wherein the array is encoded by etching apertures in the gate electrodes of selected devices and implanting ion impurities through the apertures to render the selected devices inoperative, thus defining one digit of binary information, while the remaining devices which do not have apertures in the gate electrode are operative devices or transistors defining the other digit of binary information. The read only memories employing the thick and thin gate dielectrics have a high cell density but the personalization of the memory cells must be made during the early steps of the process, whereas the read only memories having apertures in the gate electrodes require a relatively wide gate electrode or word line and, therefore, sacrifice density.

U.S. Pat. No. 4,059,825, filed Dec. 29, 1975, discloses a read only memory wherein selected transistors forming the memory cells storing one digit of information are programmed by an ion implant step which produces in these transistors a threshold voltage of about zero to permanently turn on these transistors. The other digit of binary information is represented by transistors which do not have this ion implant and, therefore, having a higher threshold voltage. The programming of this memory occurs during the early steps of the process prior to forming the gate electrodes of the transistors.

A read only memory disclosed in U.S. Pat. No. 4,096,522, filed Aug. 8, 1977, is personalized at a relatively late stage during the processing thereof by completing connections between the source and drain electrodes and the channel region of the transistors after the gate electrodes of the transistors have been formed. However, this process sacrifices density since a gap or space must be provided near each gate electrode to complete by ion implantation the source and drain electrodes on the transistors selected for storing one digit of binary information while that gap or space serves as an open circuit in transistors selected for storing the other digit of binary information.

U.S. Pat. No. 4,045,811, filed Aug. 4, 1975, describes a read only memory wherein selected transistors are made non-operative or with a high threshold by providing diffused regions under the gate electrodes in the channel regions which serve to raise the value of the threshold voltage of these transistors above a voltage value normally applied to the gate electrodes of the transistors during the operation of the memory. These diffused regions are formed in the channel regions during a relatively early step in the process and prior to forming the gate electrodes.

In U.S. Pat. No. 4,161,039, filed FEB. 6, 1978, there is disclosed a memory array utilizing field effect transistors wherein information is stored in floating gates and the channel region is made short by employing double-diffusion processing techniques, as disclosed in more detail in "Electronics", Feb. 15, 1971, at pages 99–104. This memory is not a simple read only memory but it can be reprogrammed by erasing the stored information with ultraviolet light.

SUMMARY OF THE INVENTION

It is an object of this invention to provide a method of making a transistor array which has a high density of transistors with predetermined threshold voltages.

It is another object of this invention to provide a method of making a transistor array wherein the step at which the array is programmed or personalized is during the late stages of the process for making the transistors.

It is still another object of this invention to provide a method of making a transistor array wherein the step at which the array is programmed or personalized is during the late stages of the process for making the transistors and wherein the array has a high density of transistors with predetermined threshold voltages.

It is yet another object of this invention to provide a method of making a read only memory which has a high density of field effect transistors wherein each of the transistors has one of several predetermined threshold voltages and wherein the memory is programmed or personalized during the late stages of the process for making the transistors.

In accordance with the teachings of this invention, a method of making a transistor array, such as may be used in a read only memory, is provided which includes forming a plurality of gate electrodes defining channels in and insulated from a semiconductor substrate having a given conductivity, forming diffusion regions with a first impurity of a conductivity opposite to that of the given conductivity in the semiconductor substrate defined by edges of the gate electrodes, introducing a second impurity having the given conductivity into selected diffusion regions, the second impurity having a higher diffusivity in the semiconductor substrate than that of the first impurity and driving the second impurity along the surface of the semiconductor substrate to alter the conductivity of the channels adjacent the selected diffusion regions. In one embodiment of the invention, a read only memory has a P type semiconductor substrate with source and drain regions defined by the gate electrode utilizing arsenic as the first impurity, with the second impurity being boron. The boron, having a higher diffusivity than that of arsenic, is driven under selected gate electrodes by appropriately heating the substrate to increase the concentration of the P type impurity therein so as to significantly increase the threshold voltages of the transistors having the selected gate electrodes. The transistors with the high threshold voltage store one digit of binary information whereas the remaining transistors having a significantly lower threshold voltage store the other digit of binary information in a very compact and simply produced array.

The foregoing and other objects, features and advantages of the invention will be apparent from the following more particular description of the preferred embodiments of the invention, as illustrated in the accompanying drawing.

DESCRIPTION OF THE PREFERRED EMBODIMENTS

Figure 1:
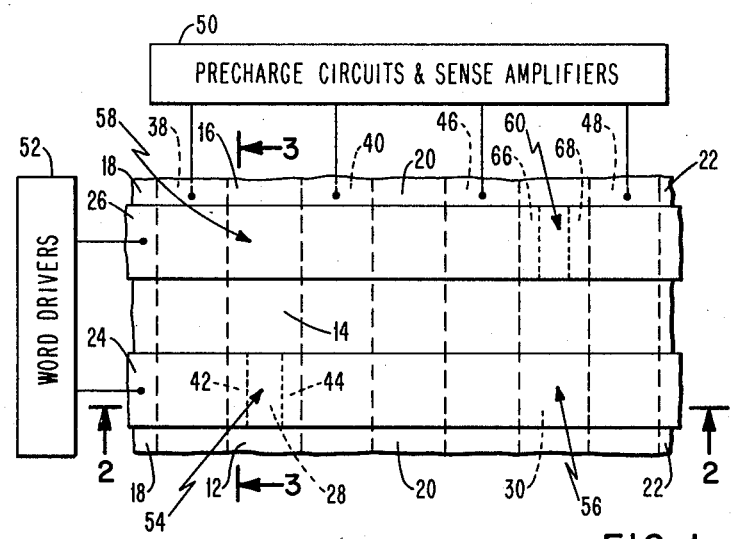
FIG. 1 illustrates in substantially plan view a read only memory having a transistor array made in accordance with the teachings of this invention.
Figure 3:
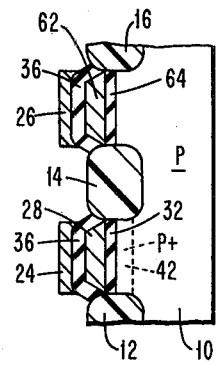
FIG. 3 is another sectional view of the array of FIG. 1 taken through line 3—3 thereof.
Figure 2:
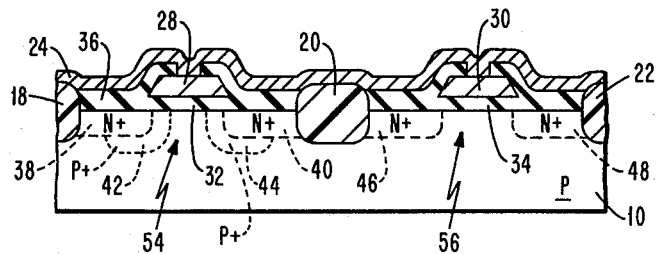
FIG. 2 is a sectional view of the array of FIG. 1 taken through line 2—2 thereof.

Referring to FIGS. 1, 2 and 3 of the drawing in more detail, there is shown one embodiment of the read only memory made by the method of the present invention. The read only memory includes a semiconductor substrate 10 made of P type conductivity in which there is formed recessed oxide segments 12, 14 and 16 seen more clearly in FIG. 3 and recessed oxide strips 18, 20 and 22 as seen more clearly in FIG. 2 of the drawing. A first word line 24 is disposed between the recessed oxide segments 12 and 14, as indicated in, e.g., FIG. 3, and second word line 26 is disposed between the recessed oxide segments 14 and 16. The first and second word lines 24 and 26 may be made of metal such as aluminum or other suitable conductors. The first word line 24 is connected to a gate electrode 28 which is separated from the semiconductor substrate 10 by a thin dielectric layer 32, made preferably of silicon dioxide, and also to a gate electrode 30 which is separated from the semiconductor substrate 10 by a thin dielectric layer 34, also made preferably of silicon dioxide. Although for purposes of clarity the word line 24 is shown connected to the gate electrodes over the channel regions, in practice the contacts could be made as well over the isolation regions. The first and second word lines 24 and 26 are insulated from the semiconductor substrate 10 by a thick insulating layer 36.

A first N+ diffusion region 38 is formed in semiconductor substrate 10 between the gate electrode 28 and the recessed oxide strip 18 and a second N+ diffusion region 40 is formed in semiconductor substrate 10 between the gate electrode 28 and the recessed oxide strip 20, as indicated in e.g., FIG. 2 of the drawing. A first halo-like P+ region 42 is disposed in the semiconductor substrate 10 adjacent to the first N+ region 38 and between the first N+ region 38 and the second N+ region 40 and a second P+ region 44 is disposed in semiconductor substrate 10 adjacent to the second N+ region 40 and between the first and second N+ regions 38 and 40. A third N+ region 46 is formed in semiconductor substrate 10 between gate electrode 30 and recessed oxide strip 20 and a fourth N+ diffusion region 48 is formed in semiconductor substrate 10 between the gate electrode 30 and recessed oxide strip 22. The first, second, third and fourth N+ diffusion regions 38, 40, 46 and 48, respectively, are connected to precharge circuits and sense amplifiers 50, which may be of any known appropriate type, and the first and second word lines 24 and 26 are connected to word drivers 52, which may also be of any known appropriate type.

The embodiment of the read only memory shown in FIGS. 1, 2 and 3 of the drawing illustrates an array of four cells 54, 56, 58 and 60, with cells 54 and 56 being associated with the first word line 24, as can be seen in FIG. 2, and the cells 58 and 60 being associated with the second word line 26. The first cell 54 is formed by the transistor having gate electrode 28 and N+ source and drain regions 38 and 40, as well as the first and second P+ regions 42 and 44. The second cell 56 is formed by the gate electrode 30 and the third and fourth N+ source and drain regions 46 and 48. The third cell 58 associated with the second word line 26 includes a gate electrode 62, indicated in FIG. 3 of the drawing, spaced from semiconductor substrate 10 by a thin dielectric layer 64, which is also made preferably of silicon dioxide, and the first and second N+ source and drain regions 38 and 40. The fourth cell 60, also associated with the second word line 26, includes a gate electrode (not shown) and the third and fourth N+ source and drain regions 46 and 48, along with third and fourth P+ regions 66 and 68, as indicated in FIG. 1 of the drawing.

Figure 4:
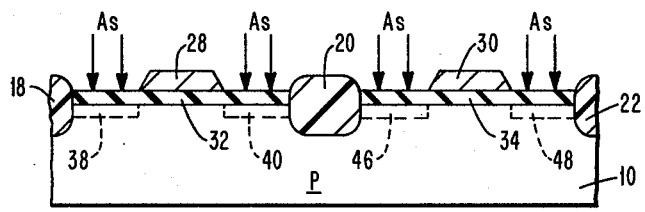
FIG. 4 is a sectional view of the array of FIG. 1 taken prior to the programming or personalization of the read only memory.
Figure 5:
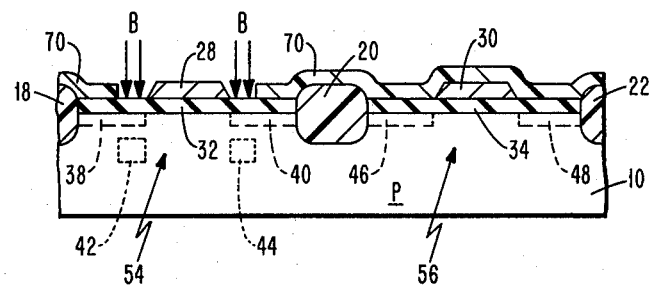
FIG. 5 is a sectional view of the array of FIG. 1 taken immediately after the read only memory has been programmed or personalized, and before further processing.

For a better understanding of the method for making the transistor array of the read only memory illustrated in FIGS. 1, 2 and 3, reference may be made to FIGS. 4 and 5 of the drawing.

By known techniques the recessed oxide strips 18, 20 and 22 and the recessed oxide segments 12, 14 and 16 are formed in the semiconductor substrate 10. If desired other known forms of isolation techniques may be substituted for the recessed oxide strips and segments, such as for example suitable field shields. After the recessed oxide segments and strips are formed in the semiconductor substrate 10, a thin layer of silicon dioxide is formed on the surface of the substrate 10 as indicated at 32 and 34 in, e.g., FIGS. 4 and 5. Typical enhancement implants may be introduced at this point into substrate 10 to adjust the threshold of all transistors or devices to a given base level, as is well known. Following the formation of the silicon dioxide layer 32, 34 and the enhancement implant, a layer of electrically conductive material, such as a layer of polysilicon or silicide, is deposited on the silicon dioxide layer 32, 34 and gate electrodes 28 and 30 are formed from the first polysilicon layer by known masking and etching techniques.

Then by using known ion implantation techniques, arsenic, indicated as As in FIG. 4 of the drawing, is introduced into the semiconductor substrate 10 to provide N+ regions 38, 40, 46 and 48, with the gate electrodes, such as gate electrodes 28 and 30, and the recessed oxide strips 18, 20 and 22 and the recessed oxide segments 12, 14 and 16 forming the necessary masking pattern.

It can be seen that at this point the method for making the transistor array each of the transistors is formed with a gate electrode and source and drain electrodes. The substrate may now be stock piled to await user's instructions on the particular personalization of the read only memory.

After the user's program or personalization requirements have been received, a suitable mask such as a photo resist mask indicated by layer 70 in FIG. 5 of the drawing is formed which completely covers the cells or transistors that are to maintain a low voltage threshold, such as cells 56 and 58, but which provide openings in the photo resist mask 70 at the cells or transistors that are to have a high threshold voltage, such as cell 54. It should be noted that the alignment of mask 70 is not critical but to reduce stray capacitance the edge of the mask 70 should fall over the N+ source and drain regions 38 and 40, as indicated in FIG. 5 of the drawing. Boron, indicated as B in FIG. 5 of the drawing, is then introduced by ion implantation techniques into the semiconductor substrate 10 with the photo resist mask 70 and the gate electrodes, such as gate electrode 28, defining the P+ regions 42 and 44, which are provided to produce the high threshold voltage in cell 54. After the boron is introduced into substrate 10, the photo resist mask 70 is removed and the polysilicon gate electrodes and the source and drain regions are oxidized to form the thick insulating layer 36. Since the boron has a higher diffusivity than that of the arsenic, by heating the substrate 10, such as during the oxidization step mentioned hereinabove, to approximately 1,000 degrees centigrade for about 100 minutes the boron will move through substrate 10 at a higher rate than will the arsenic to locate the P+ regions 42 and 44 in their final positions under gate electrode 28 between N+ source and drain regions 38 and 40 as indicated in FIG. 2 of the drawing. It is well known that different ions implanted in a semiconductor substrate subjected to heat move through the substrate at different rates of speed, as taught in, e.g., U.S. Pat. No. 3,390,019, filed Dec. 24, 1964. As indicated in FIG. 1 of the drawing, cell 60, having P+ regions 66 and 68, is formed in the same manner as cell 54 and, therefore, also has a higher threshold voltage. It has been found that the difference in threshold voltage between the low and high threshold voltages may be made as great as four volts. The word lines 24 and 26, which may be aluminum or a second layer of polysilicon, are formed in any known manner over thick insulating layer 36 and connected to the gate electrodes.

The read only memory made by the method of the present invention may be operated in a known manner. Since the transistors of the memory cells have either a low or a high threshold voltage, the word pulse applied to the word lines has a magnitude which is intermediate that of the low and high threshold voltages. Prior to applying the word pulse to a selected word line, the bit lines, e.g., lines formed by N+ diffusion regions 38 and 46, are precharged to a given potential and lines formed by N+ diffusion regions 40 and 48 are connected to ground. When the word pulse is applied to, e.g., the first word line 24, the voltage on bit line 38 will remain high due to the high transistor threshold voltage of cell 54, whereas the voltage on bit line 46 will discharge to ground due to the low transistor threshold voltage of cell 56. The bit line potentials can be readily detected in any known suitable manner. It can be seen that when the word line 26 is selected, the voltage on bit line 38 will discharge to ground and the voltage on bit line 46 will remain high.

Although, in the interest of clarity, only two cells are illustrated as being associated with each of the word lines, it should be understood that in practice 256 or more cells would be associated with each word line.

Furthermore, it should be noted that, if desired, the high threshold voltage cells may be fabricated asymmetrically by providing only one P+ region under the gate electrode, i.e., in, e.g., cell 54, only one of the P+ regions 42 and 44 need be provided to produce a high threshold device. It should also be noted that the cell density in the array can be increased further by arranging the N+ diffusion regions so that one diffusion region is shared by two or more cells in a given word line, as is well known.

The read only memory has been described hereinabove in an embodiment wherein binary information is stored in each cell. It can be seen that in accordance with the teachings of the method of this invention, each cell can be made to store multiple levels of information by introducing one of several known quantities of the boron into the channel region of the transistors. For example, four cells can be made so that each cell has a different threshold voltage by, first, implanting a given dose of boron into two cells, and second, implanting a second different dose of boron to one of previously implanted cells and one of the unimplanted cells. By using suitable sense amplifiers, the four different levels of threshold of the cells can be detected. This multilevel capability may be expressed as the number of levels equals $2^M$, where M is the number of programming masks for M programming implants. For binary storage, M is equal to 1. Each transistor is coded to one of $2^M$ threshold levels.

The arsenic used to form N+ regions 38, 40, 46 and 48 is preferably implanted with a concentration of $8 \times 10^{15}$ ions per square centimeter at 80 KeV and the boron dose used to make the P+ regions 42, 44, 66 and 68 is preferably implanted with a concentration of $1-10 \times 10^{13}$ ions per square centimeter at 100-200 KeV. The use of these impurities in semiconductor substrates is well known, as, e.g., disclosed in U.S. Pat. No. 3,834,953. It should be understood that impurities other than arsenic and boron may be used to practice this invention, e.g., antimony may be used instead of the arsenic since the diffusivity of boron is higher than that of antimony. Also it should be noted that the invention may be used to make depletion type transistors as well as enhancement type transistors by implanting a fast diffusing donor, such as phosphorus, and using a suitable heat step to connect the two N+ diffusion regions 38 and 40. Furthermore, although the illustrated embodiment has been described as having a semiconductor substrate of P type conductivity, it should be noted that a semiconductor substrate of N type conductivity may be used by interchanging the N+ and P+ regions in the substrate. Accordingly, it can be seen that a simple method for making a high density transistor array which may be used in a read only memory, or if desired in a programmable logic array, has been disclosed wherein personalization or programming of the array is not required until late in the process of making the array, i.e., after the array is approximately 80 percent complete.

While the invention has been particularly shown and described with reference to preferred embodiments thereof, it will be understood by those skilled in the art that various changes in form and details may be made therein without departing from the spirit and scope of the invention.

What is claimed is:

1. A method of making an array of transistors which includes:

forming a plurality of gate electrodes insulated from a semiconductor substrate having a given type conductivity, introducing a first impurity having a conductivity opposite to that of said given type conductivity into regions of said substrate defined by an edge of each of said gate electrodes, introducing a second impurity into selected ones of said regions along the edge of their associated gate electrodes, said second impurity having an opposite conductivity to and a significantly higher diffusivity than that of said first impurity, and heating said substrate to drive said second impurity through said substrate under the associated gate electrodes to decrease the conductivity of said substrate under said associated gate electrodes.

2. A method of making an array of transistors as set forth in claim 1 wherein said substrate has a given impurity concentration and wherein the concentration of said higher diffusivity impurity under said associated electrode gates is higher than said given impurity concentration.

3. A method of making an array of transistors as set forth in claim 1 wherein the first impurity is introduced into first regions of said substrate adjacent to a first edge of each of said gate electrodes and into second regions of said substrate adjacent to a second edge of each of said gate electrodes disposed on the opposite side of said gate electrode from said first edge for forming source and drain regions.

4. A method of making an array of transistors as set forth in claim 3 wherein said second impurity is introduced into selected ones of said first regions of said substrate.

5. A method of making an array of transistors as set forth in claim 4 wherein said first impurity is arsenic, said second impurity is boron and the given conductivity of said semiconductor substrate is P type.

6. A method of making a read only memory having an array of field effect transistors including the step of:

forming a plurality of gate electrodes insulated from channel region in a semiconductor substrate having a given conductivity, introducing a first impurity of a conductivity opposite to that of said given conductivity into a region of said substrate defined by an edge of each of said gate electrodes, introducing a second impurity of said given conductivity into selected ones of said regions along the edge of their associated gate electrodes, said second impurity having a higher diffusivity than that of said first impurity, heating said substrate to drive said second impurity through said substrate so as to form a halo-like region with respect to said first impurity for altering said given conductivity of said substrate adjacent to said gate electrodes in said channel regions, and connecting sensing means to each of said regions for determining the location of said halo-like regions in said substrate.

7. A method of making a read only memory as set forth in claim 6 wherein said impurities are introduced by ion implantation to form in said halo-like region a concentration of said second impurity higher than that in said substrate.

8. A method of making a read only memory as set forth in claim 7 wherein said first impurity is arsenic, said second impurity is boron and said semiconductor substrate has a P type conductivity and wherein said sensing means are current sensing means.

* * * * *